United States Patent
Cesura et al.

(10) Patent No.: US 6,970,125 B2
(45) Date of Patent: Nov. 29, 2005

(54) MULTISTAGE ANALOG-TO-DIGITAL CONVERTER

(75) Inventors: Giovanni Cesura, Cremona (IT);
Andrea Panigada, Pavia (IT);
Alessandro Bosi, Gadesco (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/764,133

(22) Filed: Jan. 23, 2004

(65) Prior Publication Data

US 2004/0217896 A1 Nov. 4, 2004

(30) Foreign Application Priority Data

Jan. 24, 2003 (EP) .............................................. 03425033

(51) Int. Cl.[7] .............................................. H03M 1/38
(52) U.S. Cl. ........................ 341/161; 341/155; 341/136
(58) Field of Search ............................... 341/161, 155, 341/162, 110, 118, 136

(56) References Cited

U.S. PATENT DOCUMENTS

| | | | |
|---|---|---|---|
| 6,337,651 B1 * | 1/2002 | Chiang ........................ | 341/161 |
| 6,466,153 B1 * | 10/2002 | Yu .............................. | 341/161 |
| 6,486,820 B1 * | 11/2002 | Allworth et al. ............ | 341/161 |
| 6,606,042 B2 * | 8/2003 | Sonkusale et al. .......... | 341/161 |
| 6,753,801 B2 * | 6/2004 | Rossi .......................... | 341/161 |
| 6,778,126 B2 * | 8/2004 | Ali .............................. | 341/156 |

OTHER PUBLICATIONS

Siragusa, E., et al., "Gain Error Correction Technique for Pipelined Analogue–to–Digital Converters," Electronic Letters 36(7):617–618, Mar. 30, 2000.

* cited by examiner

*Primary Examiner*—Lam T. Mai
(74) *Attorney, Agent, or Firm*—Lisa K. Jorgenson; E. Russell Tarleton; Seed IP Law Group PLLC

(57) ABSTRACT

An analog-to-digital converter with a pipeline architecture for converting an analog input signal into a digital output signal with a predefined resolution includes a plurality of stages, each stage having a circuit for converting an analog local signal into a digital local signal with a local resolution lower than the predefined resolution, a circuit for determining an analog residue indicative of a quantization error of the converting circuit, a circuit for amplifying the analog residue by an inter-stage gain corresponding to the local resolution to generate the analog local signal for a next stage, and a circuit for combining the digital local signals of all the stages into the digital output signal weighting each digital local signal according to a digital weight depending on the corresponding inter-stage gain. The combining circuit includes, for at least one of the stages, a circuit for dynamically estimating a digital correction signal indicative of an analog error of the corresponding inter-stage gain, and a circuit for controlling the digital weight according to the digital correction signal.

31 Claims, 3 Drawing Sheets

MULTISTAGE ANALOG-TO-DIGITAL CONVERTER

BACKGROUND OF THE INVENTION

1. Field of the Invention

The present invention relates to an Analog-To-Digital converter having a pipeline architecture.

2. Description of the Related Art

Analog-To-Digital (ADC) converters are commonly used in a wide variety of applications (for example, in the telecommunication field), whenever an analog signal is to be converted into a corresponding digital signal. For this purpose, many kinds of converters have been proposed in the last years. In a particular architecture, known as pipeline or multistage, the converter uses a series of stages providing successive approximations of the digital signal.

Particularly, each stage performs a low-resolution conversion and produces a sub-set of the desired bits of the digital signal. A residue of the analog signal (representing a quantization error of the conversion) is then passed to a next stage in the pipeline; the next stage generates a further sub-set of lower significant bits of the digital signal, and so on until the last stage of the pipeline. This architecture provides high resolutions, using very simple and inexpensive stages.

Typically, the residues are amplified by a pre-set analog gain before being passed to the next stages; in this way, each stage operates with a similar input signal range. However, any error in the (inter-stage) gain causes a harmonic distortion in the digital signal generated by the converter.

This problem is particular acute in the first stages of the pipeline (since the corresponding error in the inter-stage gain is amplified by all the next stages). The inherent imprecision of the inter-stage gain (due to the limits of the technological process used to implement the converter) then strongly reduces the actual resolution that can be achieved.

For example, a converter at 14 bits with stages at 1 bit (wherein the inter-stage gain is 2), would require a precision in the inter-stage gain of the first stage equal to $\frac{1}{2}^{13}$ $_\rho$0.012%; this precision is substantially impossible to achieve, particularly when the converter is integrated in a chip of semiconductor material (or in any case it would require very expensive manufacturing techniques, such as laser trimming processes).

BRIEF SUMMARY OF THE INVENTION

The disclosed embodiment of the present invention overcomes the above-mentioned drawbacks.

In accordance with one embodiment of the present invention, an analog-to-digital converter is provided with a pipeline architecture for converting an analog input signal into a digital output signal with a predefined resolution. The converter includes a plurality of stages, each stage having a circuit for converting an analog local signal into a digital local signal with a local resolution lower than said resolution, a circuit for determining an analog residue indicative of a quantization error of the converting circuit, and a circuit for amplifying the analog residue by an inter-stage gain corresponding to the local resolution to generate the analog local signal for a next stage, and wherein the converter further includes a circuit for combining the digital local signals of all the stages into the digital output signal weighting each digital local signal according to a digital weight depending on the corresponding inter-stage gain; the combining circuit further includes, for at least one of the stages, a circuit for dynamically estimating a digital correction signal indicative of an analog error of the corresponding inter-stage gain, and a circuit for controlling the digital weight according to the digital correction signal.

Moreover, a corresponding analog-to-digital conversion method is also encompassed. The method includes converting an analog input signal into a digital output signal with a predefined resolution using an analog-to-digital converter with a pipeline architecture including a plurality of stages, wherein for each stage the method includes the steps of: converting an analog local signal into a digital local signal with a local resolution lower than the predefined resolution, determining an analog residue indicative of a quantization error of a converting circuit, and amplifying the analog residue by an inter-stage gain corresponding to the local resolution to generate the analog local signal for a next stage, and wherein the method further includes the step of: combining the digital local signals of all the stages into the digital output signal, weighting each digital local signal according to a digital weight depending on the corresponding inter-stage gain, and for at least one of the stages: dynamically estimating a digital correction signal indicative of an analog error of the corresponding inter-stage gain, and controlling the digital weight according to the digital correction signal.

An analog-to-digital converter, comprising: a plurality of converter stages arranged in a pipeline architecture for converting an analog input signal into a digital output signal with a predefined resolution, each stage comprising a circuit for amplifying an analog residue by an inter-stage gain corresponding to a local resolution to generate an analog local signal for a next stage and a local digital signal; and a combining circuit for combining the local digital signals of all the stages into the digital output signal, the combining stage configured to weight each digital local signal according to a digital weight depending on the corresponding inter-stage gain, and for at least one of the stages a circuit for dynamically estimating a digital correction signal indicative of an analog error of the corresponding inter-stage gain and a circuit for controlling the digital weight according to the digital correction signal.

BRIEF DESCRIPTION OF THE DRAWINGS

Further features and advantages of the solution according to the present invention will be made clear by the following description of a preferred embodiment thereof, given purely by way of a non-restrictive indication, with reference to the attached figures, in which.

DETAILED DESCRIPTION OF THE INVENTION

Figure 1:
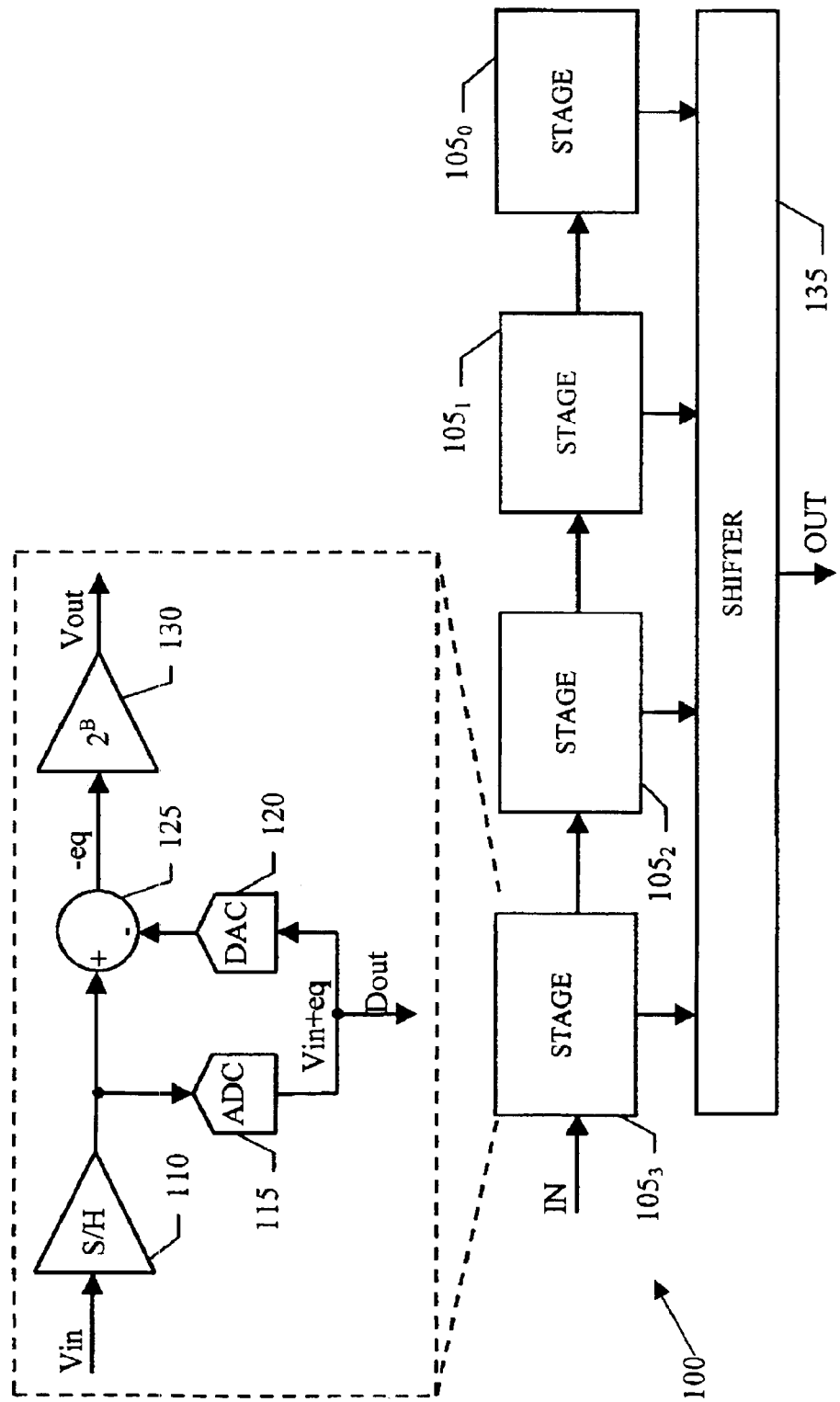
FIG. 1 is a schematic block diagram of a converter known in the art.

With reference in particular to FIG. 1, an Analog-To-Digital (ADC) converter 100 is shown; the converter 100 receives a (continuous) wide-band analog input signal IN, which is converted into a corresponding digital output signal OUT (for example, with a resolution of 16 bits). The converter 100 has a pipeline architecture with multiple cascade-connected stages 105₃–105₀ (four in the example at issue). Each stage $105_3$–$105_0$ performs a low-resolution conversion (for example, generating B=4 bits of the digital output signal OUT), and provides an analog signal, indicative of a quantization error of the conversion, to the next stage.

In detail, as shown in the expanded view of a generic stage (for example, the first stage $105_3$), a sample/hold (S/H) amplifier 110 receives an analog (local) input signal Vin from the previous stage (with Vin=IN for the first stage $105_3$). The sampled signal Vin is supplied to a flash ADC 115, so as to be converted into a corresponding digital (local) output signal Dout of B=4 bits; the digital output signal Dout represents the analog input signal Vin with the addition of a residue eq introduced by the quantization error of the ADC 115 (in the following, the analog signals and the corresponding digital signals will be denoted with the same symbols for the sake of simplicity).

The digital output signal Dout is also applied to a Digital-To-Analog (DAC) converter 120. The DAC 120 re-converts the digital output signal Dout into a corresponding analog signal. An adder 125 subtracts the analog output signal Dout=Vin+eq from the analog input signal Vin (from the sample/hold amplifier 110). The resulting analog residue (-eq) is applied to an amplifier 130 having an analog inter-stage gain $2^B$. The amplifier 130 generates an analog output signal Vout=(-eq)$2^B$ that is passed to the next stage (with the exception of the last stage $105_0$ containing the ADC 115 only). In this way, the next stage operates with a similar input signal range (being the dynamic of the analog residue eq equal to Vin/$2^B$).

A shifter 135 combines the signals Dout provided by all the stages $105_3$–$105_0$ into the overall digital output signal OUT. Particularly, the last stage $105_0$ directly generates the 4 least significant bits (LSB) of the digital output signal OUT. The last but one stage $105_1$ provides the 4 more significant bits of the digital output signal OUT; as a consequence, the digital signal Dout output by the stage $105_1$ is multiplied by a digital weight $2^B$ corresponding to the inter-stage gain (i.e., it is shifted of B positions) and then added to the digital signal Dout output by the stage $105_0$. Likewise, the digital signal Dout output by the stage $105_2$ is weighted by a factor $2^B 2^B = 2^{2B}$ (i.e., it is shifted of 2B positions), and so on until the first stage $105_3$ that provides the 4 most significant bits (MSB) of the digital output signal OUT.

Figure 2:
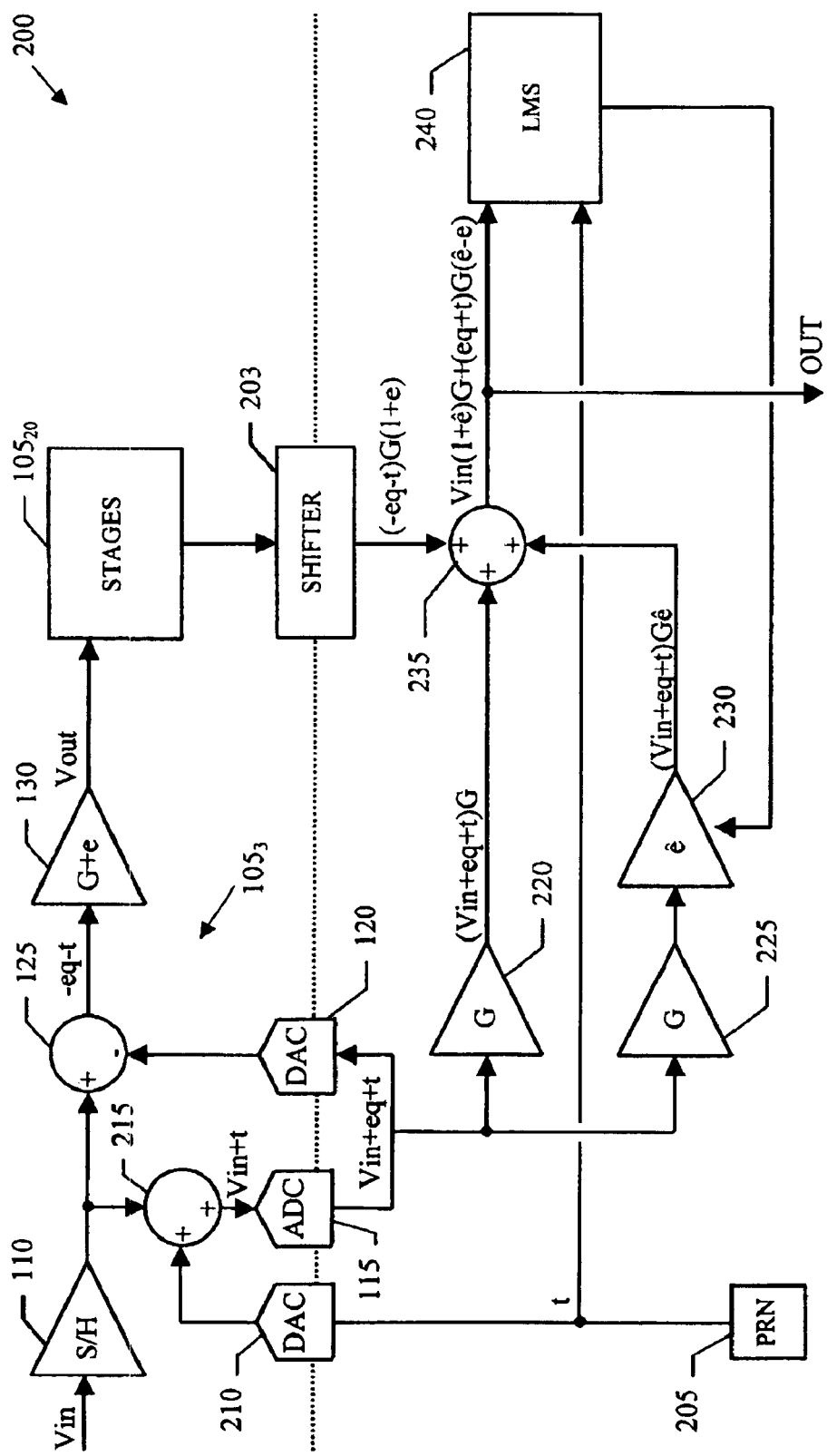
FIG. 2 shows a preferred embodiment of the converter according to the present invention.

Considering now FIG. 2, a pipeline converter 200 according to a preferred embodiment of the present invention is shown (the elements corresponding to the ones shown in FIG. 1 are denoted with the same references, and their explanation is omitted for the sake of simplicity). In the figure, all the signals placed above the horizontal dotted line are analog, whereas all the signals placed below this line are digital.

The disclosed embodiment of the invention is based on the concept that the desired resolution of the converter can be achieved even irrespectively of the precision of the amplifiers providing the inter-stage gains. In the proposed method, the analog error introduced by each amplifier is estimated dynamically; the digital output signals are then combined weighting them according to digital factors that approximate the inter-stage gains with the desired precision.

In the example shown in FIG. 2, the concepts of the present inventions are applied to the first stage $115_3$ of the converter only. In this case, the stage $115_3$ passes the analog output signal Vout (indicative of the corresponding quantization error) to the next stages of the pipeline (denoted as a whole with $105_{20}$). A shifter 203 (corresponding to a portion of the circuit 135 of FIG. 1) combines the digital signals output by the stages $105_{20}$ as in the prior art. A new circuit 204 then combines (according to the proposed method) the digital signal output by the stage $105_3$ with the result of the conversion performed by the next stage $105_{20}$ (from the shifter 203).

In detail, a Pseudo-Random Noise (PRN) generator 205 provides a digital test signal t of 1 bit; the digital test signal t takes the logic values 0,1 with a law that simulates randomness. A DAC 210 converts the digital test signal t into a corresponding analog signal. An adder 215 sums the analog test signal t to the analog input signal Vin (from the sample/hold amplifier 110). The resulting analog signal Vin+t is applied to the ADC 115, so as to be converted into a corresponding digital signal Vin+eq+t (wherein eq is the residue introduced by the quantization error of the ADC 115). In order to avoid overflow of the ADC 115 (when the analog input signal Vin reaches its full-scale value), the dynamic of the analog test signal t should be lower than a half LSB of the ADC 115 (for example, -10 mV for the logic value 0 and +10 mV for the logic value 1).

As a consequence, the amplifier 130 receives an analog signal -eq-t from the adder 125. Denoting with e the (unknown) analog error of the amplifier 130, the analog output signal Vout that is passed to the next stages $105_{20}$ will be (-eq-t)$2^B$(1+e). The next stages $105_{20}$ convert this analog signal into corresponding digital output signals; the shifter 203 accordingly combines these digital output signals into a digital signal (-eq-t)G(1+e), wherein G is the digital representation of the (ideal) total inter-stage gain of the stages $105_3$–$105_1$.

At the same time, a multiplier 220 multiplies the digital signal Vin+eq+t (from the ADC 115) by the digital weight G, so as to output a digital signal (Vin+eq+t)G. A further multiplier 225 performs the same operation. The resulting digital signal (Vin+eq+t)G is then applied to an input of a multiplier 230; the other input of the multiplier 230 receives a digital correction signal ê (generated as described in the following); as a consequence, the multiplier 230 outputs a digital signal (Vin+eq+t)Gê.

The digital signal (-eq-t)G(1+e) from the shifter 203, the digital signal (Vin+eq+t)G from the multiplier 220, and the digital signal (Vin+eq+t)Gê from the multiplier 230 are provided to an adder 235. The resulting digital signal Vin(1+ê)G+(eq+t)G(ê-e) is input to a logic module 240. The logic module 240 also receives the digital test signal t from the PRN generator 205 directly. The logic module 240 estimates the digital correction signal ê correlating these input signals; particularly, the logic module 240 calculates the digital correction signal ê that approximates the digital representation of the analog error e minimizing their difference according to a Least Mean Square Algorithm (LMS).

The digital signal Vin(1+ê)G+(eq+t)G(ê-e) from the adder 235 represents the digital output signal OUT of the whole converter 200. In the ideal condition wherein ê=e, the digital output signal OUT is then equal to Vin(1+ê)G. In this way, the additive term (including the digital test signal t) due to the analog error e of the amplifier 130 providing the inter-stage gain is deleted; therefore, the harmonic distortion caused by the imprecision of the inter-stage gain is eliminated, or at least substantially reduced (the remaining term (1+ê) is a simple scaling factor, which does not affect the digital output signal OUT).

Experimental results have shown that the structure described above provides higher performance (measured by the Equivalent Number Of Bits, or ENOB, parameter); for example, a converter at 14 bits with an analog error equal to 2% in the inter-stage gain, nevertheless exhibits a Signal to Noise Distortion Ratio (SNDR) and a Spurious Free Dynamic Range (SFDR) that are close to their theoretical values.

However, the concepts of the present invention are also applicable when the analog input signal is of a different type, when the pipeline converter includes another number of stages, or when each stage provides a different number of bits (down to a single one). Similar considerations apply if the test signal has a different dynamic, or if equivalent functional blocks are used. Moreover, although the pipeline converter has been described with a simplified combination of the digital signals output by the different stages, similar considerations apply if these digital signals are combined in a different manner; for example, the range of each stage is typically greater than one LSB of the previous stage (for digital error correction). Likewise, the same concepts are applicable to the next stages of the pipeline; in this case, the digital signal output by each one of the involved stages is weighted according to a digital correction signal that estimates the analog error in the inter-stage gain of both the current stage and the next (involved) stages.

Figure 3:
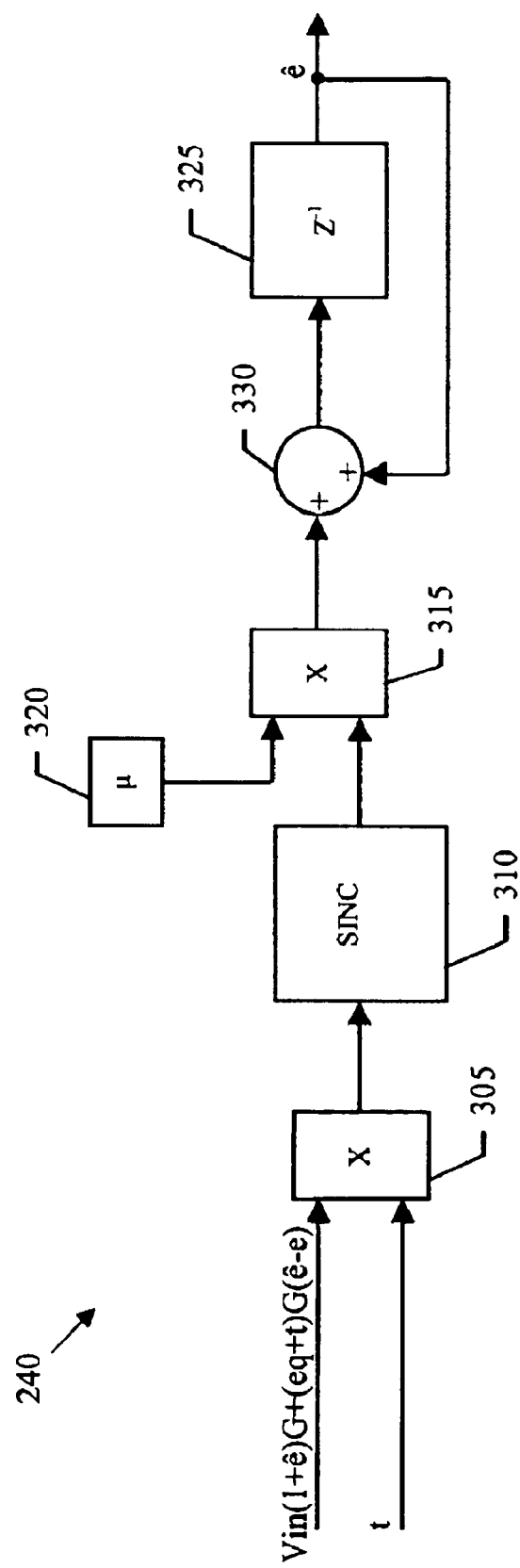
FIG. 3 depicts the functional blocks of a logic module of the converter of the invention.

Moving now to FIG. 3, the logic module 240 includes a multiplier 305 receiving the digital signal Vin(1+ê)G+(eq+t)G(ê−e) and the digital test signal t. The digital signal resulting from their product, i.e., tVin(1+ê)G+t(eq+t)G(ê−e), is applied to a sinc filter 310 of the first order. The sinc filter 310 calculates the mean value of a number of samples of the input signal defined by a decimation parameter (for example, 1024). In this way, the multiplier 305 and the sinc filter 310 perform an operation that approximates a correlation of the digital signal Vin(1+ê)G+(eq+t)G(ê−e) and of the digital test signal t. The result of this operation provides a digital signal, which is proportional to a residual difference of the digital correction signal ê with respect to the digital representation of the analog error e (being the signals Vin and t non-correlated to each other, so that the term tVin(1+ê)G disappears in the mean value).

A multiplier 315 scales down the digital residual difference by a digital weight $\mu$ stored in a register 320. The resulting digital signal is provided to an integrator, which calculates the digital correction signal ê. In detail, a delay block 325 (implemented with a bank of flip-flops) accumulates the digital correction signal ê. An adder 330 sums the (scaled-down) digital residual difference to the (previous) digital correction signal ê, which is provided by the delay block 325 with a feedback loop. The resulting (current) digital correction signal ê is then latched by the delay block 325. In this way, the digital correction signal ê converges towards the digital representation of the analog error e (until their difference falls below a threshold value).

The digital weight $\mu$ defines the precision and the convergence speed of the process. Low values of the digital weight $\mu$ increase the precision; in this case, the digital residual difference affects the digital signal applied to the integrator 325,330 to a lower extent, so as to compensate for the inherent imprecision of the sinc filter 310 (caused by the finite number of samples taken into consideration); however, this slows down the convergence speed of the process. Conversely, high values of the digital weight $\mu$ increase the convergence speed of the process, but reduce its precision. The process can be controlled also acting on the decimation parameter of the sinc filter 310. In fact, a higher number of samples increases the precision of the correlation and then of the whole process.

However, the concepts of the present invention are also applicable when the logic module has a different structure or includes equivalent functional blocks; for example, similar considerations apply if the sinc filter is replaced with an equivalent element, if the decimation parameter has another value, if the digital residual difference is scaled down in a different manner, and the like.

More generally, the present invention proposes an analog-to-digital converter with a pipeline architecture, which is used to convert an analog input signal into a digital output signal with a predefined resolution. The converter includes a plurality of stages. Each stage has means for converting an analog local signal into a digital local signal with a local resolution (which is lower than said resolution). Means are provided for determining an analog residue indicative of a quantization error of the means for converting. The stage also has means for amplifying the analog residue by an inter-stage gain corresponding to the local resolution, in order to generate the analog local signal for a next stage. Moreover, the converter further includes means for combining the digital local signals of all the stages into the digital output signal; this result is achieved weighting each digital local signal according to a digital weight depending on the corresponding analog gain. In the converter of the invention the means for combining includes, for one or more of the stages, means for dynamically estimating a digital error indicative of an analog error of the corresponding analog gain; means are then used for controlling the digital weight according to the digital error.

The solution of the invention substantially reduces the distortion (in the digital signal generated by the converter) caused by the analog error in the inter-stage gain.

This result is achieved operating in the digital domain; moreover, it is independent of the precision of the analog amplifier providing the inter-stage gain.

Therefore, the proposed solution virtually makes it possible to obtain any desired resolution of the converter. In any case, the design specifics of the analog components included in the converter can be relaxed. This results in a reduction of the power consumption and of the occupied area (when the converter is integrated in a chip of semiconductor material); moreover, the converter can be manufactured at lower cost (for the same precision).

The above describe advantages are particularly important when the converter works with a wide-band analog input signal; moreover, these advantages are clearly perceived if the converter is used in consumer products, especially if they are portable (such as mobile telephones); however, different applications of the converter are contemplated and within the scope of the present invention.

The preferred embodiment of the invention described above offers further advantages.

Particularly, the digital correction signal is estimated exploiting a digital test signal that is input into the stage (and then comparing the digital test signal with the digital local signals of the next stages in the pipeline).

The proposed technique can be used in the background, without interfering with operation of the converter.

Preferably, the digital correction signal is obtained correlating the digital test signal with the digital local signals of the next stages (assuming that the digital test signal and the analog input signal are non-correlated).

This solution provides a very high degree of accuracy.

A suggested choice for the digital test signal is that of a pseudo-random signal.

In this way, inexpensive components can be used to generate a digital test signal that is always non-correlated with the analog input signal.

Advantageously, the digital test signal is converted into a corresponding analog test signal and then added to the analog local signal.

The proposed structure makes it possible to achieve the desired result without any risk of overflow.

However, the solution according to the present invention leads itself to be implemented even exploiting different techniques for dynamically estimating the digital correction signal. Alternatively, the test signal is generated in a different manner or is inserted in another position (provided that its transfer function is the same as the one of the analog residue).

In a preferred embodiment of the present invention, the correlation is performed suitably weighting and summing the digital signal output by the stage with the digital signal provided by the next stages in the pipeline.

These operations are used to remove (in a very simple manner) both the effects of the analog error in the inter-stage gain and the digital test signal from the result of the whole conversion.

As a further enhancement, a digital residual difference of the correlation process is scaled down.

This additional feature makes it possible to tune the process according to the opposed requirements of precision and speed.

A suggested choice for implementing the correlation process is that of using a sinc filter.

The proposed scheme provides an additional way of controlling the precision of the process (acting on the decimation parameter of the sinc filter); for example, the digital residual difference can be scaled down to a lower extent (thereby increasing the speed of the process) when a higher decimation parameter is used.

Preferably, the concepts of the present invention are applied to one or more of the first stages in the pipeline.

In this way, the analog errors in the inter-stage gains are corrected only when they are more deleterious.

However, the converter according to the present invention is also suitable to be implemented performing the correlation in a different way, without scaling down the digital residual difference, or replacing the sinc filter with different components. Alternatively, the proposed algorithm is applied to other stages of the pipeline (even to all of them, with the exception of the last stage).

All of the above U.S. patents, U.S. patent application publications, U.S. patent applications, foreign patents, foreign patent applications and non-patent publications referred to in this specification listed in the Application Data Sheet, are incorporated herein by reference, in their entirety.

Naturally, in order to satisfy local and specific requirements, a person skilled in the art may apply to the solution described above many modifications and alterations all of which, however, are included within the scope of protection of the invention as defined by the following claims and the equivalents thereof.

What is claimed is:

1. An analog-to-digital converter with a pipeline architecture for converting an analog input signal into a digital output signal with a predefined resolution, the converter comprising a plurality of stages, each stage having means for converting an analog local signal into a digital local signal with a local resolution lower than said predefined resolution, means for determining an analog residue indicative of a quantization error of the means for converting, and means for amplifying the analog residue by an inter-stage gain corresponding to the local resolution to generate the analog local signal for a next stage; and means for combining the digital local signals of all the stages into the digital output signal, weighting each digital local signal according to a digital weight depending on the corresponding inter-stage gain, the means for combining includes, for at least one of the stages, means for dynamically estimating a digital correction signal indicative of an analog error of the corresponding inter-stage gain, and means for controlling the digital weight according to the digital correction signal.

2. The converter of claim 1 wherein the means for estimating includes means for inputting a digital test signal into the at least one stage and means for deriving the digital correction signal from the digital test signal and the digital local signals of the next stages.

3. The converter of claim 2 wherein the digital test signal and the analog input signal are non-correlated, and the means for deriving the digital correction signal includes means for correlating the digital test signal with the digital local signals of the next stages.

4. The converter of claim 3 wherein the digital test signal is pseudo-random.

5. The converter of claim 4 wherein the means for inputting the digital test signal includes a pseudo-random generator for generating the digital test signal, means for converting the digital test signal into a corresponding analog test signal, and means for adding the analog test signal to the analog local signal.

6. The converter of claim 5 wherein the means for correlating includes means for calculating a first digital signal multiplying the digital local signal by the digital weight, means for calculating a second digital signal multiplying the digital local signal by the digital weight and the digital correction signal, means for calculating the digital output signal summing the first digital signal, the second digital signal and the digital local signals of the next stages, and means for calculating the digital correction signal from the digital test signal and the digital output signal.

7. The converter of claim 5 wherein the means for calculating the digital correction signal includes means for calculating a digital residual difference approximating a correlation between the digital test signal and the digital output signal, means for scaling down the digital residual difference, and an integrator for converging towards the digital correction signal according to the digital residual difference.

8. The converter of claim 7 wherein the means for calculating the digital residual difference includes a multiplier for calculating a third digital signal multiplying the digital test signal by the digital output signal and a digital filter for calculating the digital residual difference from the third digital signal.

9. The converter of claim 1 wherein the at least one stage consists of a sub-set of consecutive stages starting from a first stage.

10. A method of converting an analog input signal into a digital output signal with a predefined resolution using an analog-to-digital converter having a pipeline architecture including a plurality of stages, wherein for each stage the method includes the steps of:

converting an analog local signal into a digital local signal with a local resolution lower than said predefined resolution, determining an analog residue indicative of a quantization error of the stage, and amplifying the analog residue by an inter-stage gain corresponding to the local resolution to generate the analog local signal for a next stage, and wherein the method further includes the step of:

combining the digital local signals of all the stages into the digital output signal, weighting each digital local signal according to a digital weight depending on the corresponding inter-stage gain, and for at least one of the stages:

dynamically estimating a digital correction signal indicative of an analog error of the corresponding inter-stage gain, and controlling the digital weight according to the digital correction signal.

11. An analog-to-digital converter, comprising:

a plurality of converter stages comprising a first stage and subsequent stages arranged in a pipeline architecture for converting an analog input signal into a digital output signal with a predefined resolution, each subsequent stage comprising a circuit for amplifying an analog residue by an inter-stage gain corresponding to a local resolution to generate an analog local signal for a next subsequent stage; and a combining circuit for combining digital local output signals of all the stages into the digital output signal, the combining stage configured to weight each digital local output signal according to a digital weight depending on the corresponding inter-stage gain, and for at least one of the stages a circuit for dynamically estimating a digital correction signal indicative of an analog error of the corresponding inter-stage gain and a circuit for controlling the digital weight according to the digital correction signal.

12. The converter of claim 11, further comprising an estimation circuit for inputting a digital test signal into the at least one stage and a circuit for deriving the digital correction signal from the digital test signal and the digital local signals of the next subsequent stages.

13. An analog-to-digital converter, comprising:

a plurality of stages arranged in a pipeline architecture for converting an analog input signal into a digital output signal with a predefined resolution, the plurality of stages including a first stage configured to receive the analog input signal, each of the plurality of stages configured to output a local digital signal; and a combining circuit configured to combine the local digital signals of all the stages into a digital output signal that weights each local digital signal according to a digital weight depending on a corresponding inter-stage gain, the combining circuit including, for at least one of the stages, a circuit for dynamically estimating a digital correction signal indicative of an analog error of the corresponding inter-stage gain and a circuit for controlling the digital weight according to the digital correction signal.

14. The converter of claim 13, wherein the combining circuit comprises a digital test signal generator for inserting a test signal into at least the first stage, an amplifier having an input coupled to an output of the first stage and an output coupled to an adder; a second amplifier having an input coupled to the first stage and having an output coupled to a circuit for controlling the digital weight and having an output coupled to the adder, the adder having an input coupled to an output of the shifter and an output coupled to an output of the converter and to an input of a circuit for correlating the digital test signal with local digital signals of the stages that have an output coupled to the circuit for controlling the digital weight.

15. The converter of claim 13, further comprising a shifter configured to receive the local digital signals from the plurality of stages.

16. An analog-to-digital converter with a pipeline architecture for converting an analog input signal into a digital output signal with a predefined resolution, the converter comprising a plurality of stages, each stage having means for converting an analog local signal into a digital local signal with a local resolution lower than the predefined resolution, means for determining an analog residue indicative of a quantization error of the means for converting, and means for amplifying the analog residue by an inter-stage gain corresponding to the local resolution to generate the analog local signal for a next stage; and means for combining the digital local signals of all the stages into the digital output signal, weighting each digital local signal according to a digital weight depending on the corresponding inter-stage gain, the means for combining include, for at least one of the stages, means for dynamically estimating a digital correction signal indicative of an analog error of the corresponding inter-stage gain, and means for controlling the digital weight according to the digital correction signal, wherein the means for estimating include means for inputting a digital test signal into the at least one stage and means for deriving the digital correction signal from the digital test signal and the digital local signals of the next stages.

17. The converter of claim 16 wherein the digital test signal and the analog input signal are non-correlated, and the means for deriving the digital correction signal include means for correlating the digital test signal with the digital local signals of the next stages.

18. The converter of claim 17 wherein the digital test signal is pseudo-random.

19. The converter of claim 18 wherein the means for inputting the digital test signal include a pseudo-random generator for generating the digital test signal, means for converting the digital test signal into a corresponding analog test signal, and means for adding the analog test signal to the analog local signal.

20. The converter of claim 19 wherein the means for correlating include means for calculating a first digital signal multiplying the digital local signal by the digital weight, means for calculating a second digital signal multiplying the digital local signal by the digital weight and the digital correction signal, means for calculating the digital output signal summing the first digital signal, the second digital signal, and the digital local signals of the next stages, and means for calculating the digital correction signal from the digital test signal and the digital output signal.

21. The converter of claim 19 wherein the means for calculating the digital correction signal include means for calculating a digital residual difference approximating a correlation between the digital test signal and the digital output signal, means for scaling down the digital residual difference, and an integrator for converging towards the digital correction signal according to the digital residual difference.

22. The converter of claim 21 wherein the means for calculating the digital residual difference include a multiplier for calculating a third digital signal multiplying the digital test signal by the digital output signal and a digital filter for calculating the digital residual difference from the third digital signal.

23. The converter of claim 16 wherein the at least one stage consists of a sub-set of consecutive stages starting from a first stage.

24. An analog-to-digital converter, comprising:
a plurality of stages arranged in a pipeline architecture for converting an analog input signal into a digital output signal with a predefined resolution, the plurality of stages including a first stage configured to receive the analog input signal, each of the plurality of stages configured to output a local digital signal; and
a combining circuit configured to combine the local digital signals of all the stages into a digital output signal that weights each local digital signal according to a digital weight depending on a corresponding inter-stage gain, the combining circuit including, for at least one of the stages, a circuit for dynamically estimating a digital correction signal indicative of an analog error of the corresponding inter-stage gain and a circuit for controlling the digital weight according to the digital correction signal, wherein the combining circuit comprises a digital test signal generator for inserting a test signal into at least the first stage, an amplifier having an input coupled to an output of the first stage and an output coupled to an adder; a second amplifier having an input coupled to the first stage and having an output coupled to a circuit for controlling the digital weight and having an output coupled to the adder, the adder having an input coupled to an output of the shifter and an output coupled to an output of the converter and to an input of a circuit for correlating the digital test signal with local digital signals of the stages that have an output coupled to the circuit for controlling the digital weight.

25. The converter of claim 24, further comprising a shifter configured to receive the local digital signals from the plurality of stages.

26. A circuit for combining output signals from a plurality of converter stages, comprising:
a combining circuit configured to combine local digital signals generated by each stage, weighting each local digital signal according to a digital weight depending on a corresponding inter-stage gain, the combining circuit including, for at least one of the stages, a circuit for dynamically estimating a digital correction signal indicative of an analog error of the corresponding inter-stage gain and a circuit for controlling the digital weight according to the digital correction signal.

27. The circuit of claim 26, wherein the combining circuit comprises a digital test signal generator for inputting a digital test signal into the at least one stage and a circuit for deriving the digital correction signal from the digital test signal and the digital local signals of subsequent stages.

28. The circuit of claim 26, wherein the combining circuit comprises a digital test signal generator for inserting a test signal into at least the first stage, an amplifier having an input coupled to an output of the first stage and an output coupled to an adder; a second amplifier having an input coupled to the first stage and having an output coupled to a circuit for controlling the digital weight and having an output coupled to the adder, the adder having an input coupled to an output of the combining circuit and an output coupled to an output of the converter and to an input of a circuit for correlating the digital test signal with local digital signals of the stages that have an output coupled to the circuit for controlling the digital weight.

29. A method of converting an analog input signal into a digital output signal with a predefined resolution using a plurality of converter stages, each stage generating a local digital output signal, the method comprising:
combining the local digital output signals of each stage into a digital output signal, weighting each local digital output signal according to a digital weight depending on a corresponding inter-stage gain, and
for at least one of the stages:
dynamically estimating a digital correction signal indicative of an analog error of the corresponding inter-stage gain, and
controlling the digital weight according to the digital correction signal.

30. The method of claim 29, wherein each converter stage is configured to generate the local digital output signal in accordance with the following steps:
converting an analog local signal into a local digital output signal with a local resolution lower than the predefined resolution;
determining an analog residue indicative of a quantization error of the stage; and
amplifying the analog residue by the inter-stage gain corresponding to the local resolution to generate the analog local signal for a next stage.

31. The method of claim 30, further comprising inputting a digital test signal into at least a first stage and deriving the digital correction signal from the digital test signal and the local digital output signals of the next subsequent stages.

* * * * *